(12) United States Patent
Ishiyama et al.

(10) Patent No.: US 6,225,570 B1
(45) Date of Patent: May 1, 2001

(54) CIRCUIT BOARD HAVING ELECTRIC COMPONENT AND ITS MANUFACTURING METHOD

(75) Inventors: Ichiro Ishiyama; Ichiro Nagare; Morikatsu Yamazaki; Yozo Ohara; Koji Higashi, all of Toyama (JP)

(73) Assignee: Kokuriku Electric Industry Co., Ltd., Yoyama (JP)

( * ) Notice: Subject to any disclaimer, the term of this patent is extended or adjusted under 35 U.S.C. 154(b) by 0 days.

(21) Appl. No.: 09/125,260
(22) PCT Filed: Dec. 17, 1997
(86) PCT No.: PCT/JP97/04655
§ 371 Date: Aug. 10, 1998
§ 102(e) Date: Aug. 10, 1998
(87) PCT Pub. No.: WO98/27795
PCT Pub. Date: Jun. 25, 1998

(30) Foreign Application Priority Data

Dec. 17, 1996 (JP) .................................................. 8-337047
Dec. 24, 1996 (JP) .................................................. 8-343531

(51) Int. Cl.⁷ ...................................................... H05K 1/16
(52) U.S. Cl. ........................................... 174/260; 361/762
(58) Field of Search .............................. 174/260; 361/761, 361/763, 765, 766, 760, 762, 764; 338/309

(56) References Cited

U.S. PATENT DOCUMENTS

| | | | | |
|---|---|---|---|---|
| 3,849,757 | * | 11/1974 | Khammous et al. | 338/320 |
| 3,909,680 | * | 9/1975 | Tsunashima | 317/101 C |
| 4,460,938 | * | 7/1984 | Clei | 361/411 |
| 4,926,292 | * | 5/1990 | Maple | 361/402 |
| 5,384,434 | * | 1/1995 | Mandai et al. | 174/258 |
| 5,708,569 | * | 1/1998 | Howard et al. | 361/760 |
| 5,994,997 | * | 11/1999 | Brown et al. | 338/309 |

* cited by examiner

Primary Examiner—Jeffrey Gaffin
Assistant Examiner—Jeremy Norris
(74) Attorney, Agent, or Firm—Rankin, Hill, Porter & Clark LLP

(57) ABSTRACT

This invention provides a circuit board having an electric component which has an electric element smaller than a conventional element. A circuit pattern (5) which includes a pair of contact electrodes (3, 3) is formed on the surface of a board (1) made of an insulating material. A photoresist film (7) is formed on the surface of the board (1). At least one electric element forming hole (9) is formed in the photoresist film (7) by a lithography technology so as to expose at least part of the pair of the contact electrodes (3, 3). The electric element forming hole (9) is filled with an electric element forming paste material to form an electric element (13). A protective film (15) made of a synthetic resin is so formed as to cover the electric element forming hole (9).

3 Claims, 4 Drawing Sheets

1

CIRCUIT BOARD HAVING ELECTRIC COMPONENT AND ITS MANUFACTURING METHOD

FIELD OF THE INVENTION

This invention relates to a circuit board having an electric component such as a resistive element, an inductor, a capacitor or the like on a surface of a circuit board and manufacturing method thereof, and more particularly, to an electric component-mounted circuit board which is capable of achieving high density equipment of the electric components, and manufacturing method thereof.

BACKGROUND OF THE INVENTION

An electric component-mounted circuit board formed with an electric component such as a resistive element, an inductor, a capacitor or the like by printing on a substrate has been generally used. The electric component comprises electrodes and an electric element such as a resistive element, a dielectric element, or the like. A multilayered circuit board is also generally known, in which an electrically insulating layer and an electrically conductive layer are built up alternately to form multilayered structure. For the circuit boards in these structures, where printing method is used to form the electric components, conventionally, a screen process printing has been commonly adopted. A previously prepared mesh mask is used in the screen process printing. For forming the electric elements, a paste material for forming electric elements, for example, a resistive paste, is applied on the mask and spread by a squeegee. Through the pores of the mask mesh, the paste material sticks to the surface of the circuit board or onto electrodes in a circuit pattern on the surface of the circuit board. If the opening of the pores of the mesh is designed decreased, or if finer mesh is used, a minute printing is done that is intended to reduce the size of the electric element. However, even if the opening of the pores of the mesh can be decreased, decreasing the diameter of the various particles included in the electric element forming paste material is limited. Thus, under the existing circumstances, there is a certain limit for reducing the size of the electric element by the minute printing performed in decreasing the opening of the pores of the mesh. The screen process printing causes irregularity on the surface of the electric element due to the mask mesh. The more the size of the electric element is reduced, the more the roughness of the irregularity affects the electrical characteristic value of the electric element.

An object of the present invention is to provide an electric component-mounted circuit board having a reduced sized electric element than a conventional element and a method of manufacturing same.

Another object of the present invention is to provide an electric component-mounted circuit board which is capable of trimming and has a reduced sized electric element than a conventional element, and a method of manufacturing same.

DISCLOSURE OF THE INVENTION

The electric component-mounted circuit board in accordance with the present invention is formed with a circuit pattern having one or more contact electrodes on a surface of a board made of electrically insulating material. A photoresist film having one or more electric element forming holes is formed on the circuit board by a lithography technology so as to expose at least part of the contact electrode. An electric element forming hole is filled with the electric element forming paste to form an electric element. When the electric element is a resistive element or an inductor, at least part of a pair of electrodes is generally positioned in the electric element forming hole. When the electric element is a capacitor, one contact electrode (lower side electrode) is positioned in the electric element forming hole, and the other electrode (upper side electrode) is formed on the exposed surface of the electric element which is formed by filling the electric element forming paste in the electric element forming hole.

The lithography technology is a technique used in a minute process such in the manufacturing process of a semiconductor. In this technique, a photoresist film is exposed through a mask with a previously prepared pattern (photolithograpy), or, instead of the exposure, irradiation of the electron beams (electron radiation lithography) is performed. The exposed or irradiated part of the photoresist film turns to have solubility in developer different from the other part. If the exposed part becomes easily soluble, the resist film is called a positive-type, and if the exposed part becomes solvent-resistant, it is called a negative-type. The desired resist film is formed by removing the soluble part of the photoresist film by etching, either by wet etching or dry etching. In the present invention, the lithography technology is used to form the electric element forming hole in the photoresist film. In this method, the size of the electric element forming hole can be very small, even a hole having a diameter of 0.1 mm can be accurately formed. Therefore, the electric element, for example, having a size of 0.6 mm ×0.3 mm can be formed, while the minimum size of the electric element formed by screen process printing is 1.6 mm ×0.8mm.

In accordance with the present invention, the size of the electric element formed on the circuit board can be greatly smaller than a conventional element, which can consequently meet the needs of the high density of the circuit pattern on the board. The circuit board in accordance with the present invention can also be used as a core board in a multilayered circuit board for achieving higher density of the multilayered circuit board.

A protective film made of a synthetic resin paste can be provided to covet the electric element forming hole filled with the electric forming paste material for prevention of the characteristics change of the electric element. The protective film can also be used in the multilayered circuit board for prevention of the characteristics change of the electric element. For forming a multilayered circuit board, an insulating layer or a multilayered insulating layer made of a synthetic resin is further laid on the photoresist film, and a circuit pattern is formed on the insulating layer. When the electric element should be a capacitor, the upper side electrode of which can be formed simultaneously with the circuit pattern formed on the insulating layer.

For adjustment or trimming of the electrical characteristics of the electric element formed as above, a laser trimming or the other already known trimming methods can be used. However, in the multilayered circuit board, the insulating layer must have been previously formed with a trimming hole at a position corresponding to the electric element so as to expose at least part of the protective film. The trimming hole can be formed by etching or mechanically formed. Thus, the trimming of the electric element in the multilayered circuit board can be done finally after completion of the fabrication of the multilayered circuit board.

The method of manufacturing the circuit board in accordance with the present invention includes a step of forming a circuit pattern having one or more contact electrodes on the surface of the board made of insulating material, a step of forming a photoresist film on the surface of the circuit board, a step of forming one or more electric element forming holes on the photoresist film using lithography technology so as to expose part of the contact electrode, and a process of forming an electric element in the electric element forming hole by filling an electric element forming paste.

BEST MODE FOR CARRYING OUT INVENTION

Figure 1:
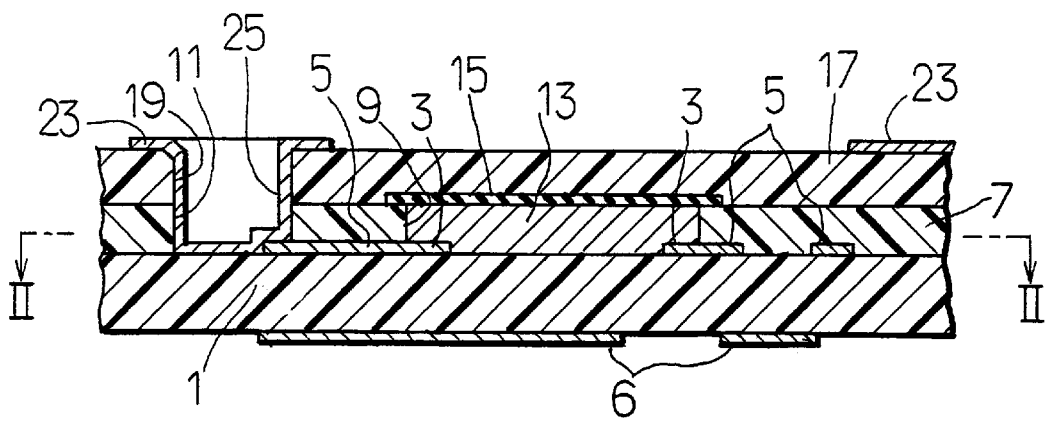
FIG. 1 is a fragmentary sectional view showing an essential part of an embodiment of an electric component-mounted circuit board in accordance with the present invention.
Figure 2:
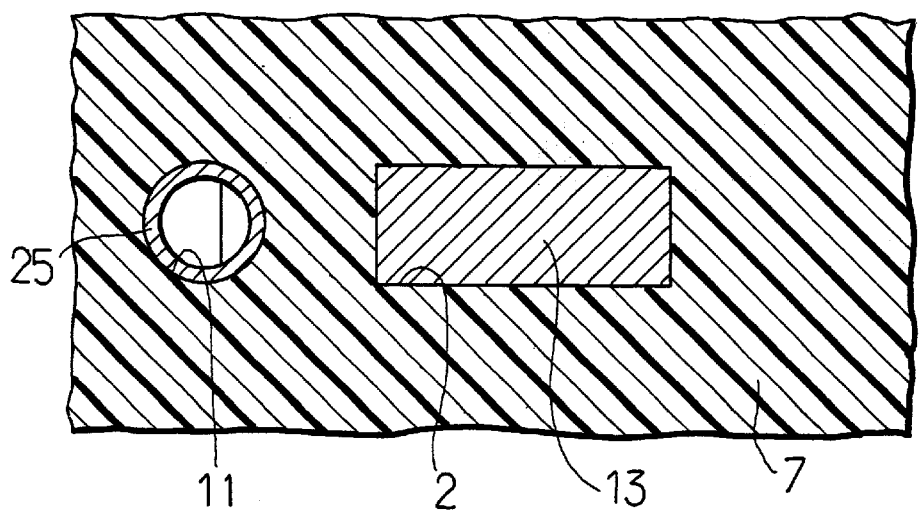
FIG. 2 is a sectional view taken along the plane of the line II—II of FIG. 1.
Figure 3:
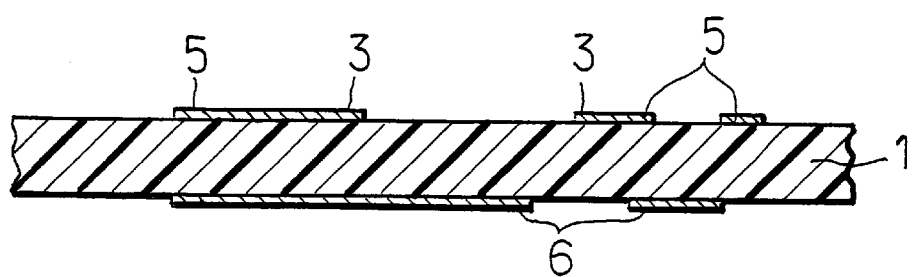
FIGS. 3 to 9 are figures each showing a state of manufacturing step of the embodiment shown in FIG. 1.

An embodiment showing the best mode for carrying out the present invention is hereinafter described with reference to the drawings. FIG. 1 is a fragmentary sectional view showing an essential part of an embodiment of an electric component-mounted circuit board in accordance with the present invention. FIG. 2 is a sectional view taken along the plane of the line II—II of FIG. 1. FIGS. 3 to 9 are figures each showing a state of manufacturing step of the embodiment shown in FIG. 1. The circuit board of this type is a multilayered circuit board formed by so-called build-up technique. Referring to FIG. 1, 1 is a board made from a rather rigid insulating substrate, such as a glass epoxy substrate, a phenol resin substrate, or the like. The circuit board 1 is formed with a circuit pattern 5 including a pair of contact electrodes 3, 3 on the front surface, and also formed with another circuit pattern 6 on the rear surface. The circuit patterns 5 and 6 can be formed either by etching a copper foil formed on the circuit board or by using an electrically conductive paste. The electrically conductive paste can be, for example, a mixture of conductive particles such as silver, copper, silver-palladium or the like and a phenol or epoxy resin binder. If the circuit pattern 5 is formed by etching the copper foil, the surfaces of the contact electrodes 3, 3 are preferably covered by such an electrically conductive paste as described above. FIG. 3 shows the board formed with the circuit patterns 5 and 6 on each surface.

Figure 4:
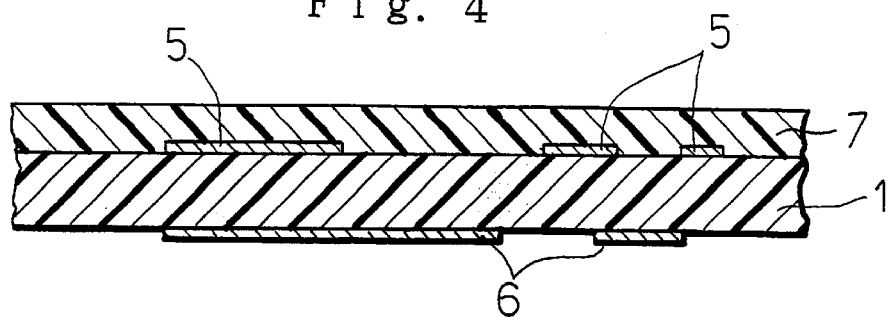
Figure 5:
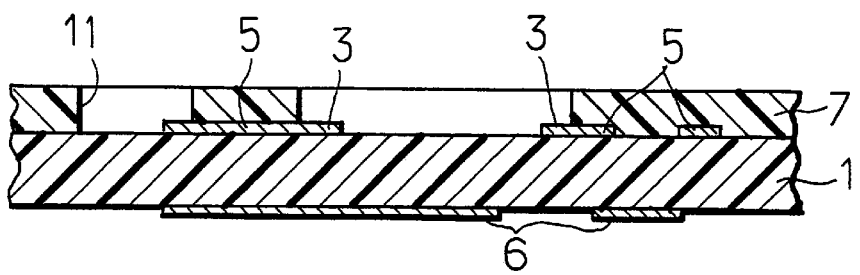
Figure 6:
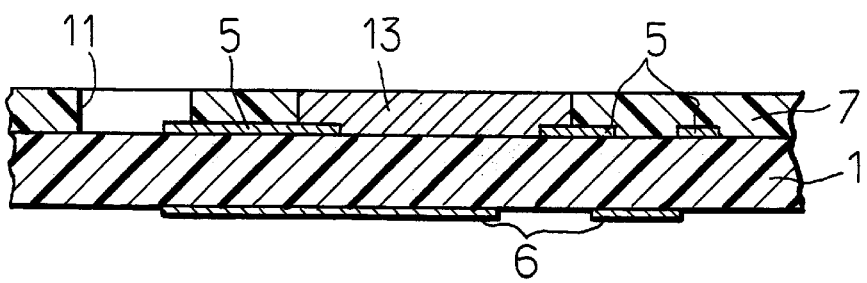
Figure 7:
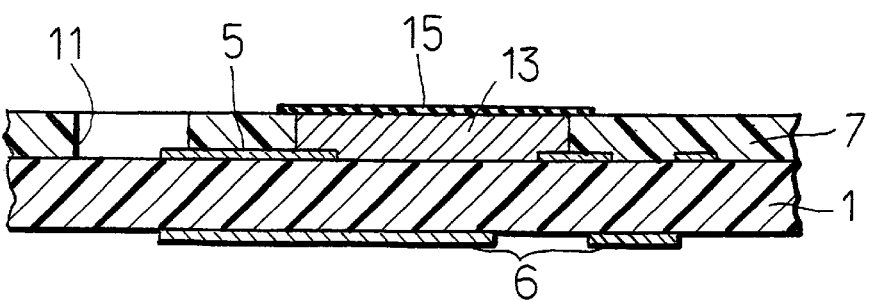
Figure 8:
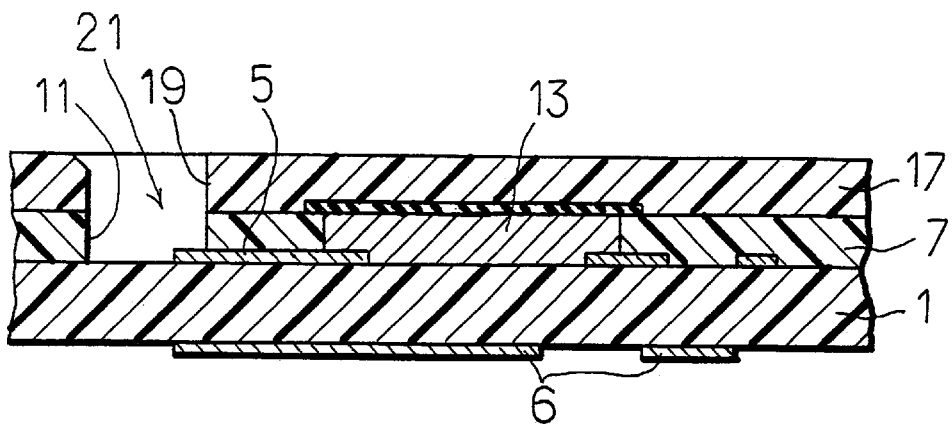

The front surface of the board 1 is further formed with a photoresist film 7 made of a photosensitive resin material such as a phenolic novolak resin or an epoxy resin. The photoresist film 7 is formed with an electric element forming hole 9 by lithography for exposing a pair of contact electrodes 3, 3 and a hole 11 for forming an electrically conducting through-hole afterwards. Referring to FIG. 4, the photoresist film 7 is so formed that first, a photosensitive resin material is applied on the whole surface of the board 1, and dried to form an unexposed photoresist film 7', which is before exposure. Then, the unexposed photoresist film 7' is exposed through a mask with a previously determined pattern for the electric element forming hole 9 and the hole 11 for forming the electrically conducting through-hole (photolithography), or, instead of the exposure, irradiation of the electron beams is performed (electron radiation lithography). In this embodiment, a positive photosensitive resin material is used that the solubility of the part where the light or the electron beam is applied increases and the part becomes soluble in developer easily. In this embodiment, the exposed or irradiated part is dissolved by wet etching using a developer. FIG. 5 shows the state that the wet etching is completed, where the photoresist film 7 is formed with the electric element forming hole 9 and the hole 11 for forming the electrically conducting through-hole. As seen in FIG. 5, a pair of contact electrodes 3, 3 is exposed in the electric element forming holes 9. The shape of the electric element forming hole 9 in this embodiment is a rectangular as shown in FIG. 2. In practice, the board is formed with a number of electric element forming holes 9 and a number of holes 11 for forming the electrically conducting through-holes. Also, if an inductor, a capacitor or the other electric element is to be formed on the board 1, the electric element forming hole 9 can be formed for each element.

An electric element 13 is formed by filling an electric element forming paste in the electric element forming hole 9. (FIGS. 1 and 6) In this embodiment, the electric element 13 is a resistive element or a resistor, so that a resistive paste made of a mixture of an epoxy or phenol thermoset resin and powdered carbon can be used for the. electric element forming paste. In this embodiment, a resistive paste made of epoxy thermoset resin is used. When the resistive paste is filled in the electric element forming hole 9, the opening of the hole 11 is covered with a mask or the like to prevent the resistive paste from entering the hole 11. The board with the resistive paste is then heated in a low-temperature calcination oven to calcine the resistive paste to form a resistive element for the electric element 13.

A protective film 15 is formed on the electric element 13.(FIGS. 1 and 7) The protective film 15 made of a synthetic resin is formed to cover the opening of the electric element forming hole 9 which is filled with the electric element forming paste material. In practice, the protective film 15 is made by applying an epoxy protective coating paint to cover the exposed part of the electric element 13 and then calcined. The thickness of the protective film 15 is 10 $\mu$m to 100 $\mu$m, practically, 20 $\mu$m to 30 $\mu$m is preferable.

On the photoresist film 7 and the protective film 15, an electrically insulating layer 17 made of a photosensitive resin material as used for the photoresist film 7 is laid. (FIGS. 1 and 8) The insulating layer 17 is also formed with a hole 19 for forming an electrically conducting through-hole by lithography. The hole 19 and the hole 11 are together forming a through hole 21. The insulating layer 17 is not limited to one layered structure but can be a multilayered structure, if necessary.

Figure 9:
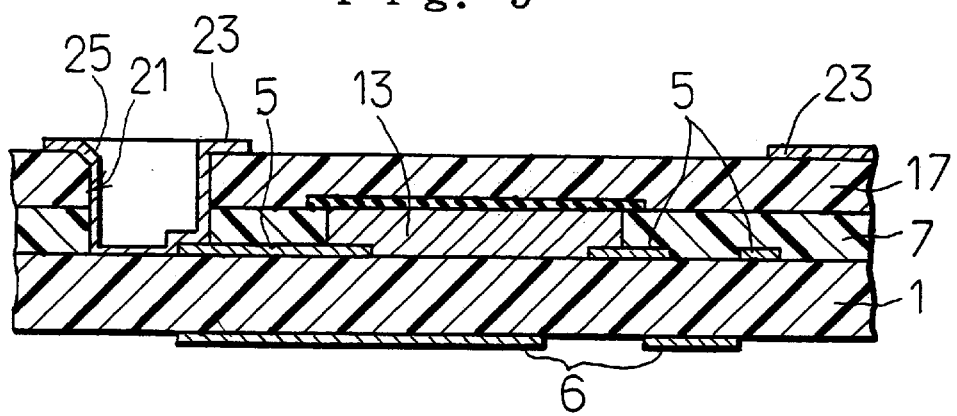

As shown in FIGS. 1 and 9, a previously determined circuit pattern 23 is formed on the insulating layer 17, and a through-hole conductive section 25 is formed in the through-hole 21 to electrically connect the circuit pattern 23 and the circuit pattern 5. The circuit pattern 23 and the through-hole conductive section 25 are formed of electrically conductive paste, for example, such as a silver paste, a silver-palladium paste, or the like.

Figure 10:
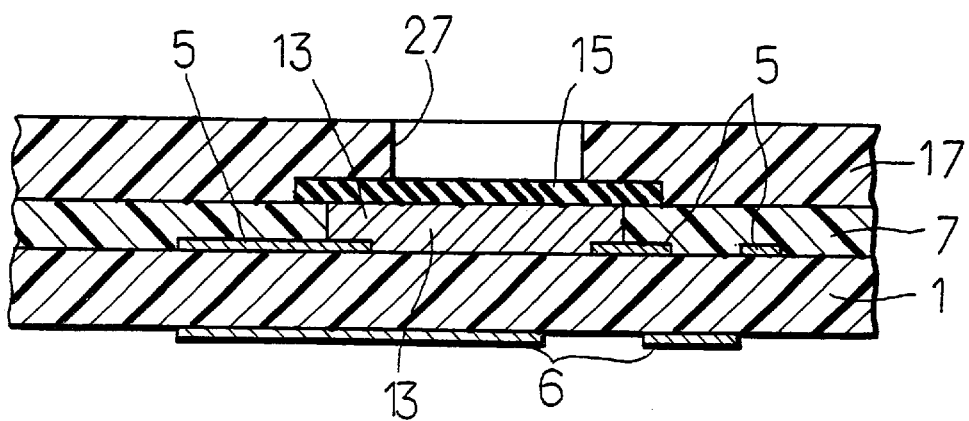
FIG. 10 is a fragmentary sectional view showing an essential part of another embodiment of the electric component-mounted circuit board in accordance with the present invention.

If trimming of the electric element 13, the resistive element in this embodiment, is necessary, a trimming hole 27 may be formed just above the protective film 15 when overlaying the insulating layer 17, so as to expose at least part of the protective film 15, as shown in FIG. 10. The case where the insulating layer 17 is made of the same photosensitive material as the material of the photoresist film 7 as in this embodiment, the trimming hole 27 can be formed by lithography simultaneously with the other necessary holes formed on the insulating layer 17. In case where the insulating layer is made of an epoxy resin or the like, the trimming hole 27 can be formed either by screen process printing or mechanically by a drill or the other working tools after the insulating layer 18 is formed.

Trimming can be performed in irradiating a laser beam to the trimming hole 27. After the trimming operation, when the protective film 15 is partially removed and a trimming groove is exposed, the trimming hole 27 can be sealed up filled with a synthetic resin.

Figure 11:
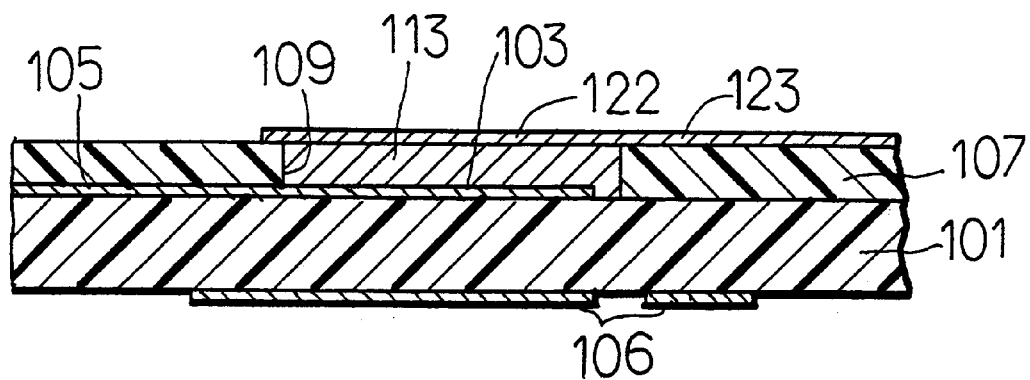
FIG. 11 is a fragmentary sectional view showing an essential part of an embodiment of an electric component-mounted circuit board in accordance with the present invention, the electric component being a capacitor.

For forming an inductor as the electric element, the shape of the electric element forming hole may be determined so as to obtain desired inductance and the electric element forming paste may be an inductor forming material such as a ferrite-resin. For forming a capacitor as the electric element, the construction should be as shown in FIG. 11, where a board 101 is formed with a circuit pattern 105 including a contact electrode 103 which is to be a lower side electrode of the capacitor. The board 101 further formed with a photoresist film 107 having an electric element forming hole 109 for exposing the contact electrode 103. The electric element forming hole 109 is filled with a dielectric paste and the dielectric paste is calcined to form a dielectric element. Then, a circuit pattern 123 including an upper side electrode 122 is formed on the photoresist film 107 by an electrically conductive paste. In this method, the printed capacitor smaller than a conventional capacitor is easily formed on the circuit board 101.

Figure 12:
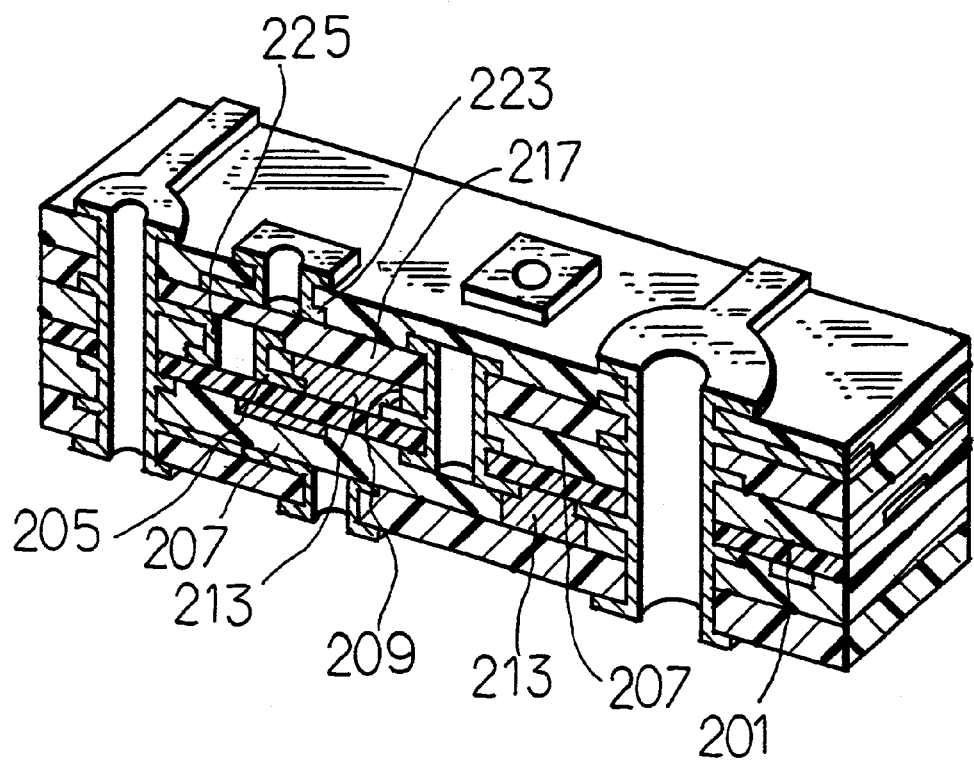
FIG. 12 is a perspective sectional view of an embodiment of a multilayered circuit board having a circuit board in accordance with the present invention as a core circuit board thereof.

FIG. 12 is a perspective sectional view of an embodiment of a multilayered circuit board having a circuit board in accordance with the present invention as an inner circuit board of it. In this embodiment, the element which is the same as the element in the structure shown in FIG. 1 bears the indication number adding 200 to the indication number of the element shown in FIG. 1. In this example, a protective film is not particularly provided on the electric element.

INDUSTRIAL APPLICABILITY

In accordance with the present invention, the size of the electric element formed on the circuit board can be greatly smaller than a conventional element, which can consequently meet the needs of the high density of the circuit pattern on the board. The circuit board in accordance with the present invention can also be used for a core board of a multilayered circuit board for achieving higher density of the multilayered circuit board than before.

We claim:
1. An electric component-mounted circuit board comprising:
   a circuit board made of electrically insulating material;
   a circuit pattern having one or more contact electrode formed on a surface of said circuit board;
   a photoresist film having one or more electric element formed on said surface of said circuit board by lithography technology so as to expose at least part of said pair of contact electrodes;
   an electric element formed by filling an electrically conductive electric element forming paste material in said electric element forming holes; and
   a protective film made of a synthetic resin for covering an opening of said electric element forming hole filled with said electric element forming paste material.

2. An electric component-mounted circuit board as defined in claim 1, further comprising one layered or a multilayered electrically insulating layer made of a synthetic resin formed on said photoresist film, said insulating layer being further formed with a circuit pattern.

3. An electric component-mounted circuit board as defined in claim 2, wherein said insulating layer is formed with a trimming hole for exposing at least part of said protective film at a position corresponding to said electric element.

* * * * *

UNITED STATES PATENT AND TRADEMARK OFFICE
CERTIFICATE OF CORRECTION

PATENT NO.    : 6,225,570 B1
DATED         : May 1, 2001
INVENTOR(S)   : Ichiro Ishiyama et al.

It is certified that error appears in the above-identified patent and that said Letters Patent is hereby corrected as shown below:

<u>Title page,</u>
Item [73], the Assignee, should be "Hokuriku Electric Industry Co., Ltd."

Signed and Sealed this

Twenty-fifth Day of June, 2002

Attest:

Attesting Officer

JAMES E. ROGAN
*Director of the United States Patent and Trademark Office*